(12) United States Patent
Sato (10) Patent No.: US 8,609,008 B2
(45) Date of Patent: Dec. 17, 2013

(54) MOLD, IMPRINT METHOD, AND METHOD OF MANUFACTURING ARTICLE

(75) Inventor: Hiroshi Sato, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/361,068

(22) Filed: Jan. 30, 2012

(65) Prior Publication Data

US 2012/0200005 A1    Aug. 9, 2012

(30) Foreign Application Priority Data

Feb. 7, 2011    (JP) .................................. 2011-024437

(51) Int. Cl.
*B29C 41/46*    (2006.01)

(52) U.S. Cl.
USPC ........................................................ 264/319

(58) Field of Classification Search
USPC ........................................................ 264/319
See application file for complete search history.

(56) References Cited

U.S. PATENT DOCUMENTS

2006/0032437 A1*    2/2006    McMackin et al. ........... 118/100

FOREIGN PATENT DOCUMENTS

| JP | 2000-323461 A | 11/2000 |
| JP | 2008-509825 A | 4/2008 |
| JP | 2009-200505 A | 9/2009 |
| JP | 4448191 B | 4/2010 |
| WO | 2006-017793 A | 2/2006 |

* cited by examiner

*Primary Examiner* — Larry Thrower (74) *Attorney, Agent, or Firm* — Rossi, Kimms & McDowell LLP (57) ABSTRACT

A surface of a mold for an imprint apparatus on a side of a substrate includes a central region having the pattern, and a pair of first peripheral regions. The central region includes a pair of boundaries parallel to a first direction. The pair of first peripheral regions are located outside the pair of boundaries parallel to the first direction. The pair of first peripheral regions include first regions in which mold-side marks are formed and second regions in which no mold-side marks are formed. A gap between the first regions and the substrate is not filled with a resin upon an imprint process. A gap between the second regions and the substrate is filled with the resin upon an imprint process. The first regions and the second regions are opposed to each other on opposite sides of the central region.

4 Claims, 8 Drawing Sheets

MOLD, IMPRINT METHOD, AND METHOD OF MANUFACTURING ARTICLE

BACKGROUND OF THE INVENTION

1. Field of the Invention

The present invention relates to a mold, an imprint method, and a method of manufacturing an article.

2. Description of the Related Art

Imprint techniques make it possible to transfer nanoscale fine patterns, and are coming into practical use as one of nanolithography techniques intended for mass production of magnetic storage media and semiconductor devices. The imprint techniques employ an apparatus such as an electron-beam exposure apparatus to form a fine pattern on a substrate such as a silicon substrate or a glass plate using a mold having a fine pattern formed on it as an original. This fine pattern is formed by coating (dispensing) a resin on the substrate, and curing the resin while the pattern of the mold is pressed against the substrate via the resin. Imprint techniques that have been put into practical use at present include the heat cycle method and the photo-curing method.

In the heat cycle method, a pattern is formed by heating a thermoplastic resin to a temperature equal to or higher than a glass transition temperature, pressing the mold against the substrate via the resin with improved flow properties, cooling the mold, and separating the mold from the resin. In the photo-curing method, a pattern is formed by irradiating an ultraviolet-curing resin with ultraviolet rays while the mold is pressed against the substrate via the resin to cure the resin, and separating the mold from the cured resin. The heat cycle method suffers from prolonging the transfer time by temperature control and degradation in dimensional accuracy due to a change in temperature, whereas the photo-curing method poses no such problem. Therefore, at present, the photo-curing method is more advantageous in mass production of nanoscale semiconductor devices.

Until today, a variety of imprint apparatuses have been realized in accordance with the resin curing methods and the purposes. Assuming an apparatus intended for mass production of, for example, semiconductor devices, an imprint apparatus which exploits step-and-flash imprint lithography (SFIL) is effective. Japanese Patent Laid-Open No. 2008-509825 discloses an imprint apparatus compatible with SFIL. Such an imprint apparatus includes a substrate stage, resin coating mechanism, imprint head, light irradiation system, and positioning mark detection mechanism. The imprint apparatus as described above adopts the so-called dye-by-dye scheme in measurement for aligning the substrate and the mold. In the dye-by-dye scheme, mold-side marks and substrate-side marks are optically simultaneously observed for each shot region upon pressing the mold against the substrate, the amount of shift is corrected, and the resin is cured.

In the dye-by-dye scheme, the mold-side marks are filled with a resin upon an imprint process. Since quartz used to form the mold has nearly the same refractive index as the resin, a sufficient contract cannot be obtained in detection when the mold is filled with the resin. Hence, Japanese Patent Laid-Open No. 2008-509825 devises a measure to prevent the mold-side marks from being filled with the resin even upon an imprint process.

Even when the mold and the substrate are pressed against each other upon bringing them into tight contact with each other in an imprint process, a very small gap remains between them. The resin enters this gap, so not only a pattern but also a resin thin film is formed on the entire surface of the substrate having undergone an imprint process, regardless of the presence/absence of the pattern. This thin film is sometimes called a residual film. However, as described in Japanese Patent Laid-Open No. 2008-509825, in a structure having mark portions which are not filled with a resin, no resin thin film is formed in the mark portions, so a difference in etched state occurs between the actual element pattern portion and the mark portions upon, for example, an etching step after an imprint process.

SUMMARY OF THE INVENTION

In view of this, the present invention provides a technique advantageous in smoothly performing both alignment between each shot region and a mold, and an etching process after an imprint process.

The present invention provides a mold for an imprint apparatus, which has a pattern formed thereon and is used to transfer the pattern onto a resin coated on a substrate by an imprint process, wherein a surface of the mold on a side of the substrate includes a central region having the pattern, and a pair of first peripheral regions, the central region includes a pair of boundaries parallel to a first direction, the pair of first peripheral regions are located outside the pair of boundaries parallel to the first direction, the pair of first peripheral regions include first regions in which mold-side marks are formed and second regions in which no mold-side marks are formed, a gap between the first regions and the substrate is not filled with the resin upon an imprint process, a gap between the second regions and the substrate is filled with the resin upon an imprint process, and the first regions and the second regions are opposed to each other on opposite sides of the central region.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

First Embodiment

Figure 1:
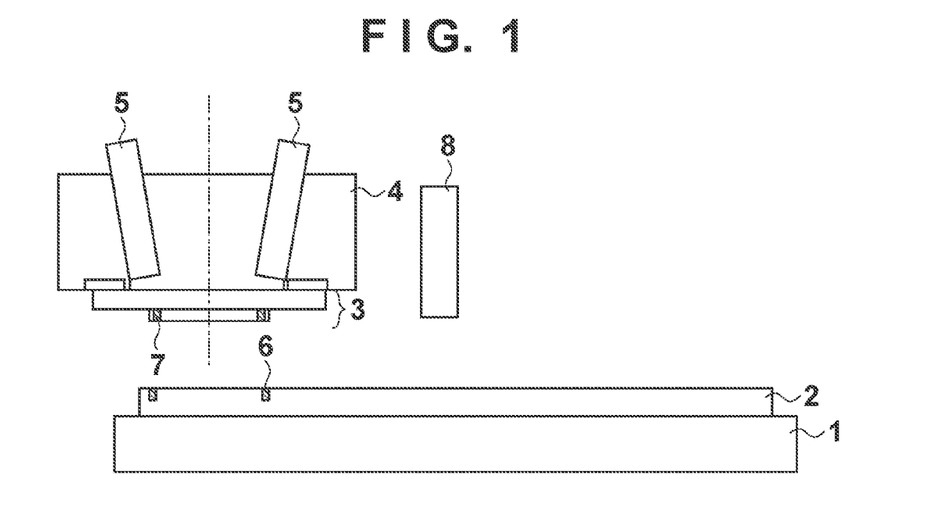
FIG. 1 is a view showing an imprint apparatus.

In an imprint apparatus, a detector (scope) 5 is fixed on a support body (head) 4, which supports a mold 3, to align the mold 3 and each shot region on a substrate 2 supported by a substrate stage 1, as shown in FIG. 1. The scope 5 is used to observe substrate-side marks 6 which are formed in each shot region on the substrate 2 and serve as indices for alignment, and mold-side marks 7 formed on the mold 3, while they are kept in proximity to each other, thereby measuring the relative position between the substrate 2 and the mold 3. If a coating mechanism 8 uses a resin with high volatility, it coats (dispenses) a resin on shot regions to undergo an imprint process, for each shot region or each set of several shot regions. However, if the coating mechanism 8 uses a resin with low volatility, an imprint process may be performed after it coats a resin on the entire surface of the substrate 2. The imprint apparatus performs an imprint operation of coating a resin on the substrate 2, and curing it while the mold 3 is pressed against the coated resin, for each shot region on the substrate 2.

Figure 2A:
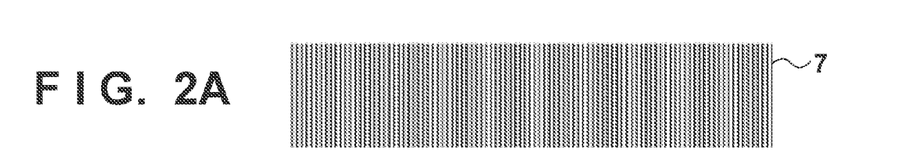
FIGS. 2A to 2D are views showing a mold-side mark and a substrate-side mark.
Figure 2B:
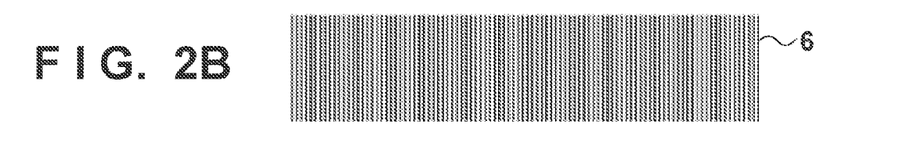
Figure 2C:
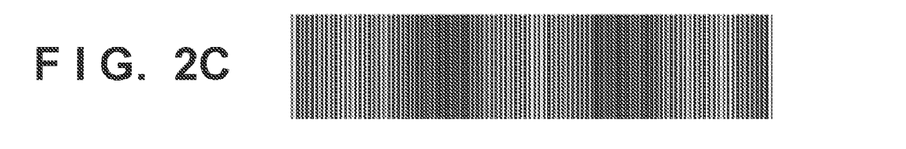
Figure 2D:
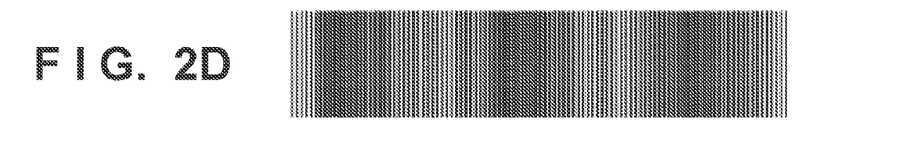

A method of measuring the relative position between a mold-side mark and a substrate-side mark using a moire pattern will be described with reference to FIGS. 2A to 2D. Two types of grating marks 7 and 6 having different pitches, shown in FIGS. 2A and 2B, are formed on the mold 3 and substrate 2, respectively. When the mold-side mark 7 and substrate-side mark 6 are superposed on each other, a bright and dark fringe pattern is generated, as shown in FIG. 2C. This fringe pattern is a moire pattern. The bright and dark positions of this fringe pattern change depending on the relative positional relationship between the mold-side mark 7 and the substrate-side mark 6. When, for example, one of the two marks 7 and 6 slightly shifts to the right, the moire pattern shown in FIG. 2C changes to that as shown in FIG. 2D. This moire pattern is generated as large bright and dark fringes upon an increase in amount of actual shift between the two marks 7 and 6, thus making it possible to accurately measure the relative positional relationship between the two marks 7 and 6 even when the scope 5 has a low resolving power. By exploiting this fact, the relative position between the mold 3 and the substrate 2 is calculated. Note that the relative positions between the mold-side marks 7 and the substrate-side marks 6 can also be simultaneously measured using, for example, an imaging optical system, instead of using a moire signal.

For dye-by-dye measurement, the relative positions between the substrate-side marks 6 and the mold-side marks 7 are measured while the actual element region of the mold 3 is kept in contact with the imprint position of the substrate 2 via the resin. The relative position between the mold 3 and the substrate 2 is then corrected using the calculated value, and the resin is cured by ultraviolet rays or heat as this relative position coincides with a correct overlay position, thereby transferring the pattern of the mold 3 onto the substrate 2.

Figure 3:
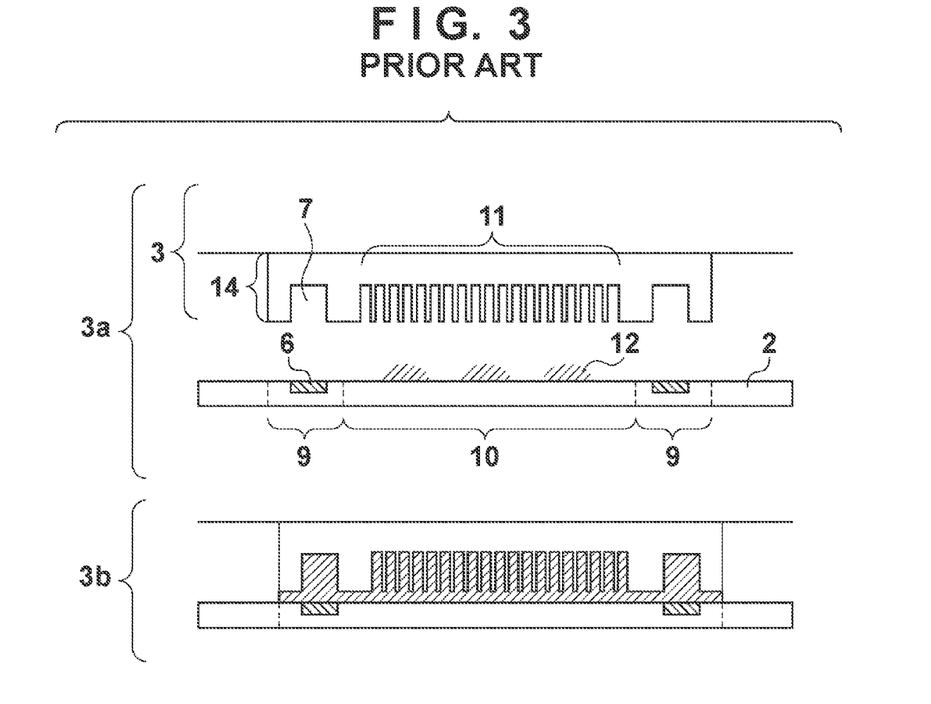
FIG. 3 shows views of the conventional imprint apparatus and imprint method.

FIG. 3 shows enlarged schematic views of the imprint portion according to the related art technique. Alignment marks (substrate-side marks) 6 are formed on scribe lines regions 9 between adjacent shot regions on the substrate 2. A pattern formed at a central region 11 of the mold 3 is transferred to a desired actual element region 10 on the substrate 2. The pattern means a pattern formed in an actual device. At this time, the substrate-side marks 6 and mold-side marks 7 are observed using the scope 5 to obtain their relative positions. Note that to bring the central region 11 and mold-side marks 7 into contact with a resin 12, the central region 11 and mold-side marks 7 are formed as a projection 14 projecting in the mold 3 in a small amount. The projection 14 shown in FIG. 3 will be referred to as a mesa 14 hereinafter.

Based on the obtained relative position information, the position of the mold 3 or substrate 2 is corrected, and the pattern of the mold 3 at the central region 11 is transferred to the actual element region 10 with good overlay accuracy by imprinting. At this time, if no special measure is implemented, the mold-side marks 7 are filled with the resin 12 upon an imprint process, as shown in 3b of FIG. 3. When the substrate-side marks 6 and mold-side marks 7 are simultaneously measured via the mold 3, the mold 3 uses a light transmissive substance such as quartz. In this case, since the mold 3 and resin 12 have nearly the same refractive index, the mold-side marks 7 cannot be observed or their contrast considerably lowers, thus making it impossible to measure the relative position between the marks 6 and 7 while the mold 3 and resin 12 are kept in contact with each other.

Hence, three measures to prevent the mold-side marks 7 from being filled with the resin 12 even upon an imprint process will be given.

Figure 4:
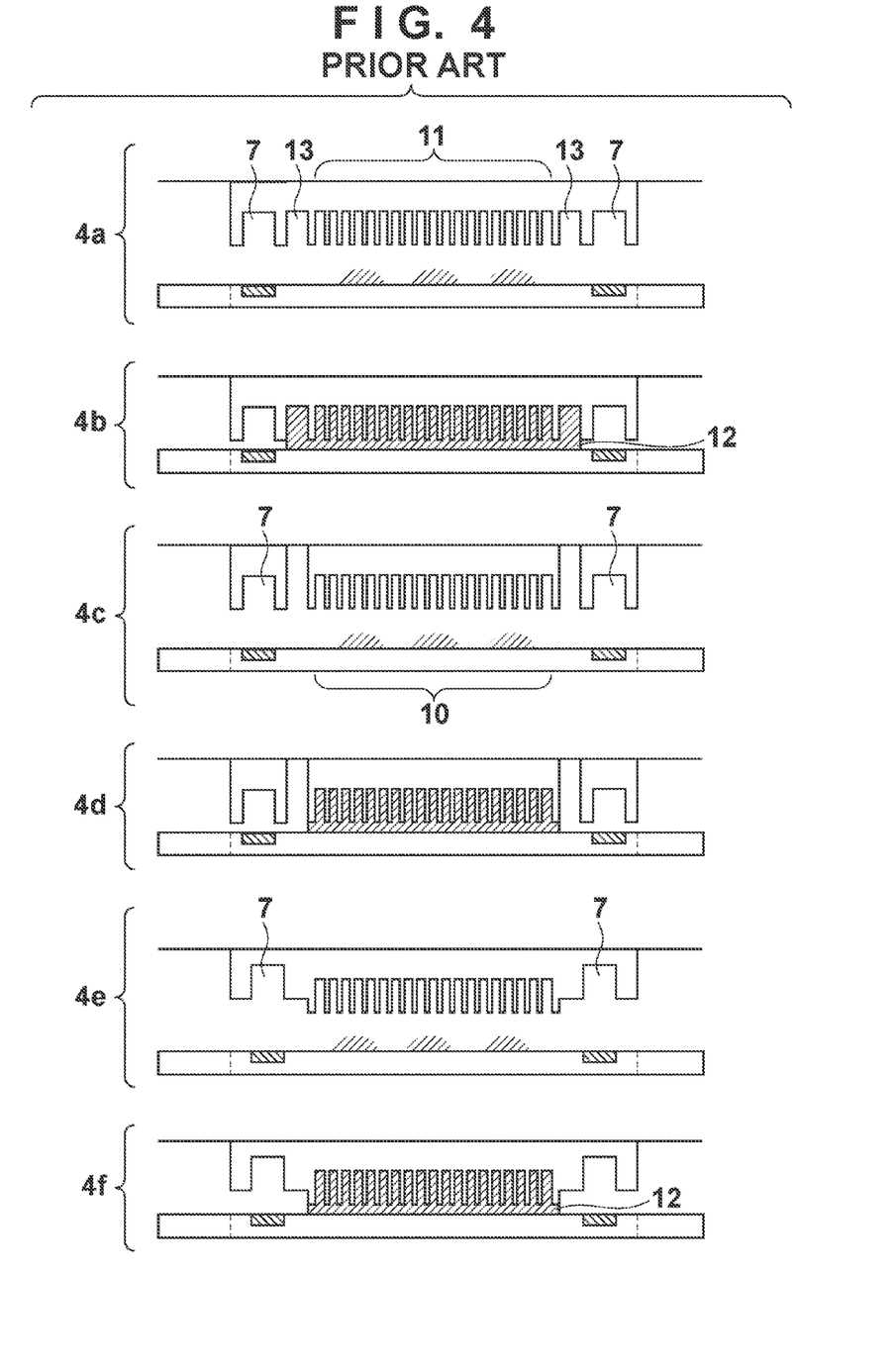
FIG. 4 shows views of modifications of the conventional imprint apparatus and imprint method.

(1) In the mold 3 shown in 4a of FIG. 4, grooves 13 are formed near the mold-side marks 7, and the resin 12 is coated only on the actual element region 10, thereby preventing the resin 12 from flowing into the mold-side marks 7. Accordingly, upon an imprint process, the resin 12 spreads on the substrate 2, but is blocked by the grooves 13, thereby preventing it from flowing into the mold-side marks 7, as shown in 4b of FIG. 4.

(2) In the mold 3 shown in 4c of FIG. 4, the mold-side marks 7 and mesa 14 are completely separated from each other. Since the mold-side marks 7 are separated from the mesa 14 more than those in the example shown in 4a of FIG. 4, the resin 12 coated on the actual element region 10 does not flow into the mold-side marks 7, as shown in 4d of FIG. 4.

(3) The mold 3 shown in 4e of FIG. 4 provides an example in which a projection structure which forms the mold-side marks 7 in the mesa is formed deeper than the central region 11, thereby preventing the resin 12 and mold-side marks 7 from coming into contact with each other. Since the resin 12 and mold-side marks 7 do not come into contact with each other, the mold-side marks 7 are not filled with the resin 12, as shown in 4f of FIG. 4.

As described above, it is possible to devise a measure to prevent the mold-side marks 7 from being filled with the resin 12 upon an imprint process. Unless the mold-side marks 7 are filled with the resin 12, they can always be detected. However, again, unless the mold-side marks 7 are filled with the resin 12, the substrate-side marks 6 remain uncovered with the resin 12.

Figure 5:
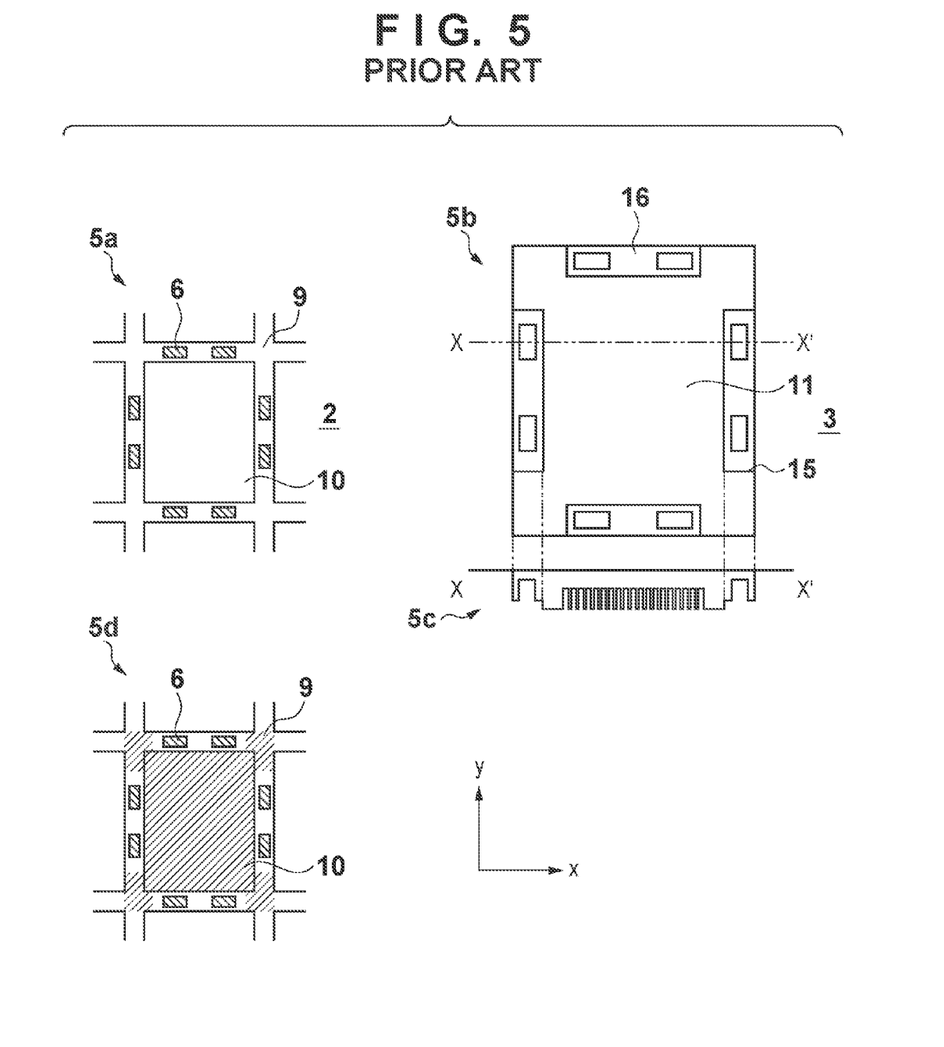
FIG. 5 shows views of the conventional imprint method.

FIG. 5 shows the result of an imprint process using the mold 3 shown in 4a, 4c, or 4e of FIG. 4. Reference numeral 5a in FIG. 5 denotes a substrate obtained by forming the patterns of the substrate-side marks 6 in an underlying layer on the substrate 2 to undergo an imprint process. Reference numeral 5b in FIG. 5 denotes the mold 3. Reference numeral 5c in FIG. 5 denotes a cross-sectional structure taken along a line X-X' in 5b of FIG. 5. In this case, the mold structure shown in 4e of FIG. 4 is taken as an example. Reference numeral 5d in FIG. 5 denotes the substrate 2 after the pattern of the mold 3 denoted by reference numeral 5b is imprinted on the substrate 2 denoted by reference numeral 5a. Naturally, because of a structure in which the mold-side marks 7 are not filled with the resin 12 upon an imprint process, the resin 12 is present in hatched portions on the substrate 2, but is absent in the portions of the substrate-side marks 6. In this state, upon uniformly etching the entire surface of the substrate 2 in the next step, a difference in etching characteristic occurs between the portions in which the resin 12 is absent and those (hatched portions) in which the resin 12 is present. This poses a problem resulting from factors associated with the quality of a product.

Figure 6:
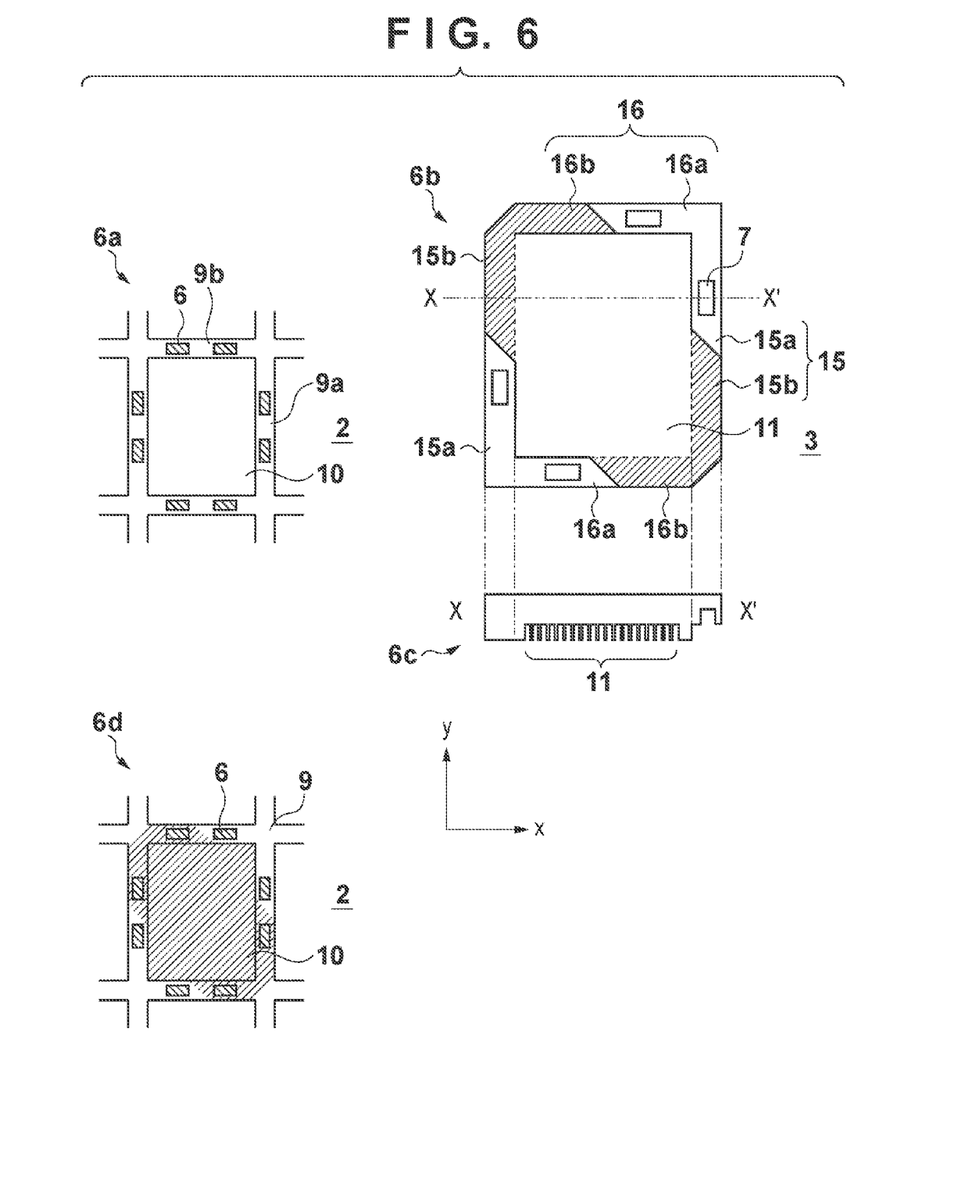
FIG. 6 shows views of a mold and an imprint method according to the present invention.

Hence, the present invention employs the following mold 3 as a mold for the imprint apparatus. Numeral reference 6b in FIG. 6 shows a top view of the mold 3, and numeral reference 6c in FIG. 6 shows a cross-sectional structure taken along a line X-X' in FIG. 6. Also, numeral reference 6a in FIG. 6 shows the vicinity of one shot region on the substrate 2. The surface of the substrate 2 includes the actual element region 10 to which the pattern of the mold 3 is transferred, and the scribe line region 9 surrounding the actual element region 10, as shown in numeral reference 6a of FIG. 6. The scribe line region 9 forms a plurality of substrate-side mark regions formed outside the shot regions. The scribe line region 9 includes first scribe line regions 9a extending in a direction parallel to the y-axis in an x-y-z coordinate system, and second scribe line regions 9b extending in a direction parallel to the x-axis in this coordinate system.

The surface of the mold 3 on the substrate side has the central region 11 with a pattern to be transferred to the actual element region 10, a pair of first peripheral regions 15, and a pair of second peripheral regions 16. The central region 11 has a boundary including a pair of sides parallel to the x-axis, and a pair of sides parallel to the y-axis. The pair of first peripheral regions 15 are located outside a pair of straight lines including the pair of sides of the central region 11, which are parallel to the y-axis, so that they are opposed to each other on opposite sides of the central region 11, in correspondence with the first scribe line regions 9a extending in a direction parallel to the y-axis. Each first peripheral region 15 includes a first region 15a and second region 15b. In the first region 15a, the mold-side mark 7 is formed, so the gap between the mold 3 and the substrate-side mark 6 formed in the first scribe line region 9a is not filled with the resin 12 upon an imprint process. In the second region 15b, no mold-side mark 7 is formed, so the gap between the mold 3 and the substrate-side mark 6 formed in the first scribe line region 9a is filled with the resin 12 upon an imprint process.

The pair of second peripheral regions 16 are located outside a pair of straight lines including the pair of sides of the central region 11, which are parallel to the x-axis, so that they are opposed to each other on opposite sides of the central region 11, in correspondence with the second scribe line regions 9b extending in a direction parallel to the x-axis. Each second peripheral region 16 includes a third region 16a and fourth region 16b. In the third region 16a, the mold-side mark 7 is formed, so the gap between the mold 3 and the substrate-side mark 6 formed in the second scribe line region 9b is not filled with the resin 12 upon an imprint process. In the fourth region 16b, no mold-side mark 7 is formed, so the gap between the mold 3 and the substrate-side mark 6 formed in the second scribe line region 9b is filled with the resin 12 upon an imprint process.

Numeral reference 6d in FIG. 6 shows a top view of the substrate after an imprint process is performed in a given shot region shown in numeral reference 6a of FIG. 6. A resin layer is formed in the actual element region 10, and regions, which fall within the scribe line region 9 and are positioned immediately below the second regions 15b and fourth regions 16b of the mold 3, in the shot region having undergone an imprint process. On the other hand, the resin 12 is not coated on regions which fall within the scribe line region 9 and are positioned immediately below the first regions 15a and third regions 16a upon an imprint process. Referring to numeral reference 6b in FIG. 6, the first region 15a and second region 15b have an axisymmetrical relationship about a straight line parallel to the y-axis, and the third region 16a and fourth region 16b have an axisymmetrical relationship about a straight line parallel to the x-axis. However, the second region 15b need not have an axisymmetrical relationship with the first region 15a about a straight line parallel to the y-axis as a whole, and need only include a region which has an axisymmetrical relationship with the first region 15a. Also, as long as the second region 15b includes a region which has an axisymmetrical relationship with the first region 15a, the fourth region 16b need not always include a region which has an axisymmetrical relationship with the third region 16a.

Referring to numeral references 6b and 6c in FIG. 6, the mold-side marks 7 have a structure in which they are not filled with the resin 12 even upon imprinting. The second regions 15b (second regions indicated by hatched portions shown in numeral reference 6b of FIG. 6) are formed so that they are symmetrical with the first regions 15a, in which the mold-side marks 7 are formed, about the y-axis across the center of the shot region. The second regions 15b are formed flat to be flush with the surface defining the projection for forming the pattern of the mold 3 at the central region 11. Similarly, the fourth regions 16b (fourth regions indicated by hatched portions shown in numeral reference 6b of FIG. 6) are formed so that they are symmetrical with the third regions 16a, in which the mold-side marks 7 are formed, about the x-axis across the center of the shot region. The fourth regions 16b are formed flat to be flush with the surface defining the projection for forming the pattern of the mold 3 at the central region 11. No mold-side marks 7 are formed in the second regions 15b and fourth regions 16b of the mold 3, which are opposed to regions defined in the scribe line region 9 in numeral reference 6d of FIG. 6 corresponding to hatched portions, but only a thin resin layer is formed in these regions, so the substrate-side marks 6 under the thin resin layer can be observed easily. To accelerate filling with the resin 12, a dummy pattern may be formed in the second region 15b and fourth region 16b. If a dummy pattern adversely affects mark observation, it may be formed in a portion other than the mark portions.

Figure 7A:
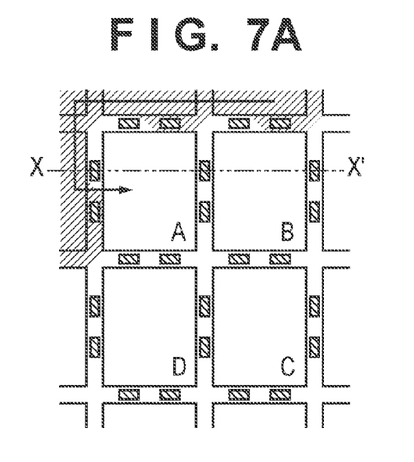
FIGS. 7A to 7E are views showing the imprint method according to the present invention.
Figure 7B:
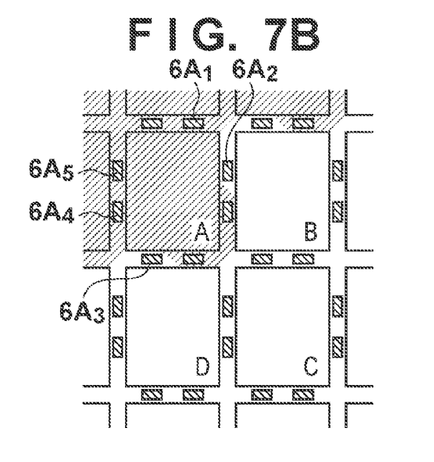
Figure 7C:
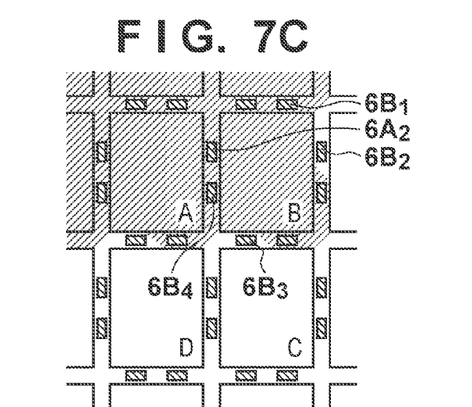
Figure 7D:
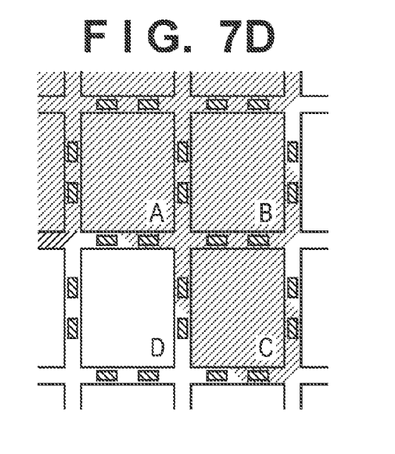
Figure 7E:
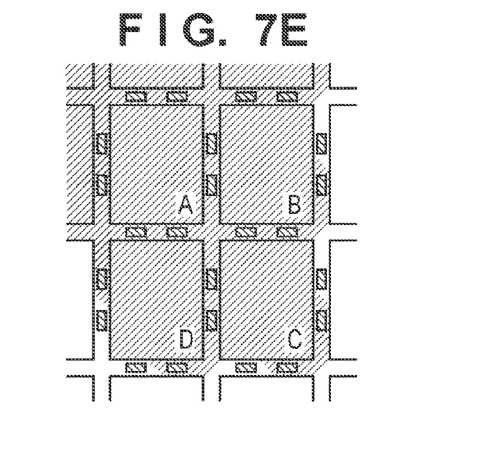
Figure 8A:
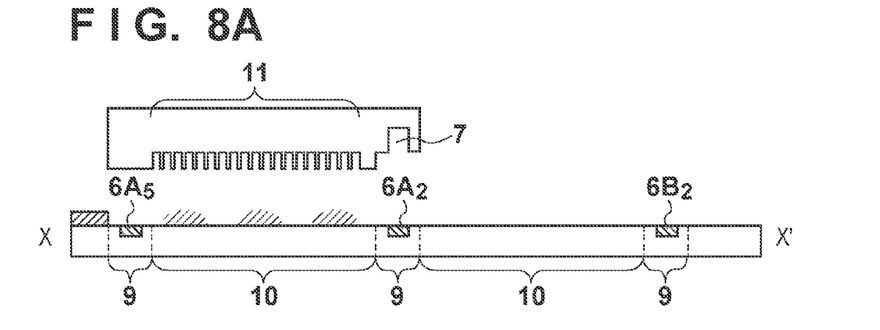
FIGS. 8A to 8E are views showing the imprint method according to the present invention.
Figure 8B:
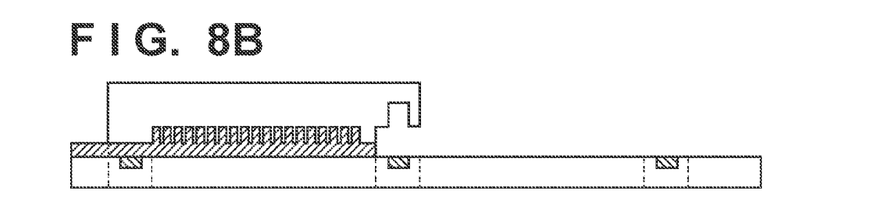

Of schematic views which show imprint processes repeatedly executed in accordance with the shot layout, FIGS. 7A to 7E show top views of the substrate 2, and FIGS. 8A to 8E show sectional views of the substrate 2 and mold 3 taken along a line X-X'. FIGS. 7A to 7E and 8A to 8E show imprint processes performed in four shot regions in FIG. 7A in the order of shot regions A to D. Note that imprint processes are performed in an order indicated by an arrow in FIG. 7A before shot region A is reached. The imprint apparatus uses the coating mechanism 8 to coat a resin on a region to be imprinted in shot region A (FIG. 8A). The imprint apparatus performs an imprint process in shot region A (FIGS. 7B and 8B). Substrate-side marks $6A_2$ and $6A_3$ can be directly observed, and the mold-side marks 7 to be aligned with the substrate-side marks $6A_2$ and $6A_3$ in an imprint process are not filled with the resin. Therefore, the relative positions between the substrate-side marks $6A_2$ and $6A_3$ and the mold-side marks 7 can be measured with high accuracy and good contrast. Also, substrate-side marks $6A_1$ and $6A_4$ have upper surfaces having already undergone an imprint process, but have only the thin resin layer formed on them, as described earlier. Therefore, the substrate-side marks $6A_1$ and $6A_4$ can be observed through the thin resin layer. If, for example, the light transmittance of the resin is too low to observe the substrate-side marks $6A_1$ and $6A_4$ because they are coated with the resin, alignment is performed using the substrate-side marks $6A_2$ and $6A_3$ in which no imprint process is performed.

Figure 8C:
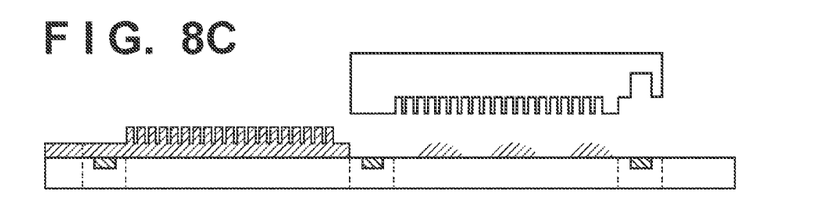
Figure 8D:
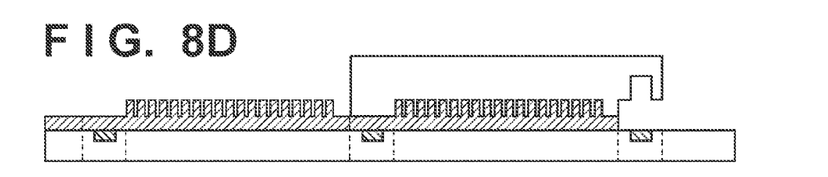
Figure 8E:
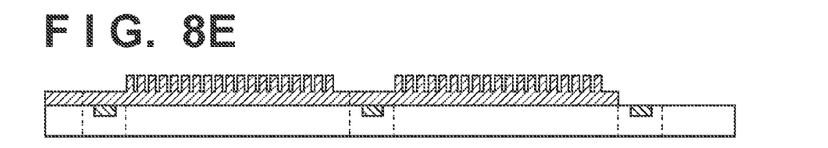
Figure 9A:
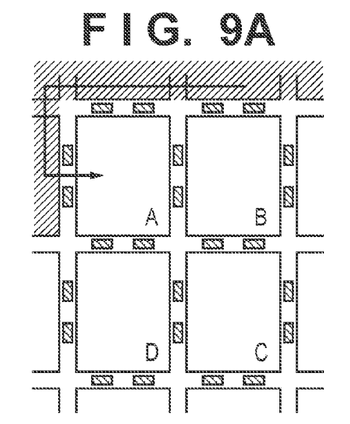
FIGS. 9A to 9E are views showing another example of the imprint method according to the present invention.
Figure 9B:
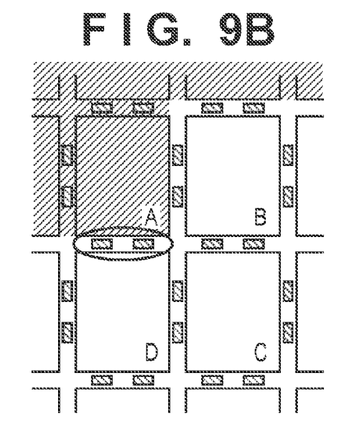
Figure 9C:
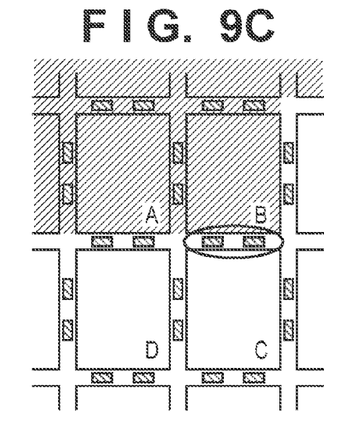
Figure 9D:
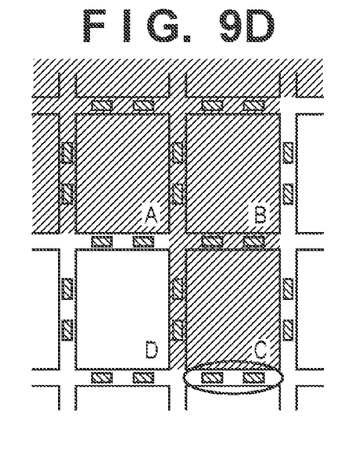
Figure 9E:
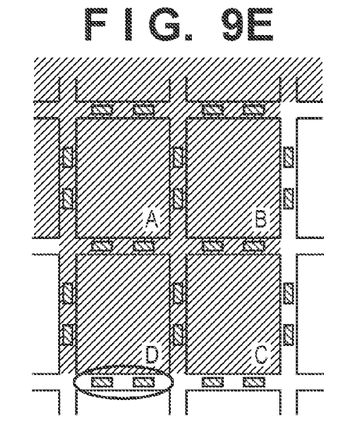

Next, the imprint apparatus uses the coating mechanism 8 to coat a resin on a region to be imprinted in adjacent shot region B (FIG. 8C). The imprint apparatus performs an imprint process in shot region B (FIGS. 7C and 8D). Substrate-side marks $6B_2$ and $6B_3$ can be directly observed because they are not coated with the resin, and the mold-side marks 7 to be aligned with the substrate-side marks $6B_2$ and $6B_3$ in an imprint process are not filled with the resin. Therefore, the relative positions between the substrate-side marks $6B_2$ and $6B_3$ and the mold-side marks 7 can be measured with high accuracy and good contrast. In this case, substrate-side marks $6B_1$ and $6B_4$ have already undergone an imprint process, but have only the thin resin layer formed on them, as described earlier. Therefore, the substrate-side marks $6B_1$ and $6B_4$ can be observed through the thin resin layer, and the thin resin layer has already cured, so the mold-side marks 7 are not filled with the resin. The substrate-side mark $6A_2$ that is not imprinted upon an imprint process in shot region A is covered with the resin when an imprint process is performed in adjacent shot region B (FIG. 7C).

FIGS. 7D and 7E show the states of the substrate 2 as a result of performing imprint processes in the remaining shot regions C and D, respectively. As can be seen from FIGS. 7D and 7E, the substrate-side mark $6A_3$ that is not imprinted upon an imprint process in shot region A is covered with the resin when an imprint process is performed in adjacent shot region D. When attention is paid to shot region A, an imprint step performed in shot region A corresponds to a first imprint step in which the scribe line region 9 surrounding shot region A is imprinted to form a region which is not filled with the resin and that which is filled with the resin. Also, an imprint step performed in, for example, shot region B adjacent to shot region A corresponds to a second imprint step in which an adjacent shot region is imprinted to fill a resin into the region which is not filled with the resin in the scribe line region 9 surrounding shot region A.

The first shot region and shot regions on the layout edge portion have portions which are not covered with a resin in the above-mentioned series of imprint processes. However, unless the entire surface is subject to the same conditions, as described earlier, position dependence occurs in a subsequent etching step. Hence, an imprint process may be performed on the wafer edge as a deficient shot region, and is similarly performed in a region which is not filled with the resin.

As described above, this method does not perform an imprint process on substrate-side marks for use in alignment in performing an imprint process using an actual element pattern, and performs an imprint process on the substrate-side marks in performing an imprint process in an adjacent shot region. This makes it possible to achieve both alignment with high accuracy and uniformization of the imprinting state of a resin within the substrate plane.

Note that even if the entire surface of the substrate is coated with a resin having low volatility, the present invention is applicable as well. Also, in this embodiment, by observing the substrate-side marks 6 formed on the four peripheral sides of each shot region, the measurement accuracy is improved, and the size and warpage, for example, of this shot region are measured as well. However, if it is only necessary to detect a positional shift of each shot region in the X and Y directions, it is also only necessary to observe the substrate-side marks 6 formed on one side of this shot region, that is, marks indicated by circle frames, as shown in FIGS. 9A to 9E. Referring to FIGS. 9A to 9E, imprinting progresses in accordance with the same procedure as in that, shown in FIGS. 7A to 7E, except that in the former an imprint process progresses upon measuring only marks on the lower side of each shot region, and therefore can be performed using a simple mold shape.

[Method of Manufacturing Article]

A method of manufacturing a device (for example, a semiconductor integrated circuit device or a liquid crystal display device) as an article includes a step of transferring (forming) a pattern onto a substrate (a wafer, a glass plate, or a film-like substrate) using the above-mentioned imprint apparatus. This method can also include a step of etching the substrate having the pattern transferred onto it. Note that when other articles such as a patterned medium (recording medium) or an optical element are to be manufactured, this method can include other processes of processing the substrate having the pattern transferred onto it, in place of etching. Although embodiments of the present invention have been described above, the present invention is not limited to these embodiments, and various modifications and changes can be made without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-024437 filed Feb. 7, 2011, which is hereby incorporated by reference herein in its entirety.

What is claimed is:

1. A method of imprinting a pattern, for each shot region on a substrate, using a mold having the pattern by bringing the mold into contact with a resin coated on the substrate, and then curing the resin,
    wherein the mold comprises:
        a central region having the pattern, and a pair of first peripheral regions on a surface of the mold, wherein:
            the central region includes a pair of boundaries parallel to a first direction,
            the pair of first peripheral regions are located outside the pair of boundaries parallel to the first direction,
            the first peripheral region includes a first region with a mold-side mark and a second region with no mold-side mark,
            a gap between the first region and the substrate is not filled with the resin upon bringing the mold into contact with the resin,
            a gap between the second region and the substrate is filled with the resin upon bringing the mold into contact with the resin, and
            the first region and the second region are opposed to each other on opposite sides of the central region;
    wherein the method comprises, for each shot region:
        an aligning step of aligning the mold and each shot region to imprint the pattern by observing a substrate-side mark on the substrate positioned below the first region not filled with the resin, and the mold-side mark; and
        an imprinting step of imprinting the pattern by bringing the mold into contact with the resin coated on the substrate without filling the resin into a first scribe line region below the first region in the aligned shot region, and then curing the resin,
    wherein the first scribe line region, which is positioned below the first region and is not filled with the resin in the imprinting step in a given shot region, is positioned below the second region and is filled with the resin in the imprinting step of a next shot region adjacent to the given shot region.

2. The method according to claim 1, wherein:
    the mold has a pair of second peripheral regions,
    the central region includes a pair of boundaries parallel to a second direction different from the first direction,
    the pair of second peripheral regions are located outside the pair of boundaries parallel to the second direction,
    the pair of second peripheral regions include third regions in which mold-side marks are formed and fourth regions in which no mold-side marks are formed, a gap between the third regions and the substrate is not filled with the resin upon bringing the mold into contact with the resin, a gap between the fourth regions and the substrate is filled with the resin upon bringing the mold into contact with the resin, the third regions and the fourth regions are opposed to each other on opposite sides of the central region;

in the aligning step a substrate-side mark, which is positioned below a third region and is not filled with the resin, and a mold-side mark are further observed, in the imprinting step, a second scribe line region below the third region in the aligned shot region is not filled with the resin, the second scribe line region, which is positioned below the third region and is not filled with the resin during the imprinting step of the given shot region, is positioned below a fourth region and is filled with the resin during the imprinting step of the next shot region adjacent to the given shot region.

3. The method according to claim 1, wherein in the stop of aligning step, the mold-side mark and a substrate-side mark having not yet been covered with the resin are observed, thereby aligning the mold and the shot region to imprint the pattern.

4. The method according to claim 1, wherein in the aligning step, the mold-side mark and a substrate-side mark, which has already been filled with the resin by an imprint process in another shot region and is covered with the cured resin, are observed, thereby aligning the mold and the shot region to imprint the pattern.

* * * * *